US007656247B2

(12) United States Patent
Kaehs

(10) Patent No.: US 7,656,247 B2
(45) Date of Patent: Feb. 2, 2010

(54) BROADBAND BALANCING TRANSFORMER

(75) Inventor: Bernhard Kaehs, Munich (DE)

(73) Assignee: Rohde & Schwarz GmbH & Co., KG, Munich (DE)

( * ) Notice: Subject to any disclaimer, the term of this patent is extended or adjusted under 35 U.S.C. 154(b) by 155 days.

(21) Appl. No.: 11/568,671

(22) PCT Filed: Apr. 14, 2005

(86) PCT No.: PCT/EP2005/003957

§ 371 (c)(1),
(2), (4) Date: Dec. 3, 2007

(87) PCT Pub. No.: WO2005/109975

PCT Pub. Date: Nov. 17, 2005

(65) Prior Publication Data

US 2008/0231388 A1 Sep. 25, 2008

(30) Foreign Application Priority Data

May 5, 2004 (DE) ...................... 10 2004 022 185

(51) Int. Cl.
*H03H 7/42* (2006.01)
*H01P 3/08* (2006.01)

(52) U.S. Cl. ........................................ 333/26; 333/238

(58) Field of Classification Search ................... 333/25, 333/26, 246, 238; 343/700 MS
See application file for complete search history.

(56) References Cited

U.S. PATENT DOCUMENTS 4,118,670 A * 10/1978 Dickens ...................... 455/327
4,847,626 A * 7/1989 Kahler et al. ......... 343/700 MS
5,917,386 A * 6/1999 Dobrovolny ............... 333/119
6,351,192 B1 2/2002 Sheen
6,448,864 B1 9/2002 Hiroshima et al.
6,917,254 B2 * 7/2005 Kaehs ......................... 333/25

FOREIGN PATENT DOCUMENTS

EP 90115279.3 9/1990

* cited by examiner

*Primary Examiner*—Dean O Takaoka
(74) *Attorney, Agent, or Firm*—Lewis, Rice & Fingersh, L.C.

(57) ABSTRACT

A balance-to-unbalance transformer (balun) comprising a first signal input/output with two symmetrical poles, a second signal input with one pole, several first conductor loop regions, which are located between the two poles of the first signal input and the ground and a second series connection of several conductor loop regions, the first terminal of the latter being connected to the pole of the second signal input. Two second conductor loop regions are electromagnetically coupled to a respective conductor loop region. The second outer terminal of the second series connection of several second conductor loop regions is electrically connected to the intermediate terminal of a first series connection of several first conductor loop regions, which connect a symmetrical pole of the first signal input to the ground.

14 Claims, 4 Drawing Sheets

BROADBAND BALANCING TRANSFORMER

CROSS REFERENCE TO RELATED APPLICATIONS

This application is a §371 National Phase of PCT Application Ser. No. PCT/EP2005/003957 which claims priority to German Patent application 10 2004 022 185.5 Filed May 5, 2004. The entire disclosure of both documents is herein incorporated by reference.

BACKGROUND

1. Field of the Invention

The invention relates to a broadband balancing transformer—balun—for transferring large high frequency powers from an unbalanced connection to a balanced bipolar connection and vice versa.

2. Description of the Related Art

For high frequency applications inter alia in the higher power range, for example in amplifiers, which are constructed to produce the sought power level from power transistors in push-pull technology, balancing transformers are necessary. These convert the high frequency signal from an unbalanced coaxial line or strip line into two signal lines which are designed to be as balanced as possible relative to each other in order to supply it to two power transistors or push-pull transistor operating in a balanced manner. Analogously, the two balanced output signals of the two power transistors or of the push-pull transistor can be converted via a balancing transformer into a high frequency signal for an unbalanced coaxial line or strip line.

In particular, production of the balancing transformer by means of strip conductors which are disposed on a printed circuit board in strip line technology is hereby desired since, with this type of production, in comparison to coaxial conductor technology, the technical manufacturing reproducibility of the balancing transformer including its electrical properties is ensured in mass production. In addition to good technical manufacturing reproducibility of the balancing transformer, strip line technology, relative to coaxial line technology, is characterized by a smaller constructional volume and lower manufacturing costs.

In EP 0 418 538 A1, a balancing transformer of this type is represented. The transfer of the high frequency signal power is hereby effected by transformational coupling between two conductor loops, one of which is connected to the unipolar connection of the unbalanced line and the other conductor loop to the bipolar balanced connection to the two power transistor amplifiers. A good transformational coupling between the two conductor loops is achieved in that the two conductor loops are produced with respect to their geometric position as strip conductors which are aligned relative to each other on the upper or lower side of a printed circuit board.

Balanced transfer ratios on the side of the balanced transformer orientated towards the power transistor amplifier are produced via the electromagnetic coupling. For this purpose, the two balanced connections of the balancing transformer are led to earth according to FIG. 1 on the side of the power transistor amplifier via symmetrically dimensioned conductor loop regions. With respect to a balanced conversion within the balancing transformer, the conductor loop on the unbalanced side which is led to earth via symmetrically dimensioned conductor loop regions is disposed in such a manner on the printed circuit board that a balanced transformational coupling is produced between these two balanced conductor loop regions on the side of the unbalanced line and the two balanced conductor loop regions on the side of the power transistor amplifier. In this way, a balanced power distribution from the unbalanced line to the two balanced poles on the side of the amplifier is ensured.

A more precise analysis of the transfer behaviour of the balancing transformer of EP 0 418 538 A1 by means of a field analyzer, such as illustrated in FIG. 2, reveals that, with a given design of the balancing transformer on the basis of clearly pronounced resonances in the transfer behaviour at approx. 1.8 GHz, a meaningful operation of the balancing transformer can be recommended only up to a frequency range of approx. 860 MHz. In addition, with a given design of the balancing transformer itself in this narrow band frequency range up to 860 MHz, the transfer behaviour at the signal input on the unbalanced side is only conditionally balanced relative to the two outputs on the amplifier side of the balancing transformer (S12, S13).

SUMMARY

The object therefore underlying the invention is to develop the balancing transformer in such a manner that its band width is significantly increased and at the same time, within this band width, a balanced power distribution from the unbalanced connection to the two balanced poles on the balanced connection is achieved.

The invention is achieved by a balancing transformer according to claim 1.

One of the two balanced conductor loop regions on the balanced side of the balancing transformer is divided into two further conductor loop regions. A transformational coupling is effected between the two conductor loop regions on the unbalanced side and the two conductor loop regions which are connected on the balanced side directly to the two balanced poles. In contrast to the state of the art, the conductor loop in its end point on the unbalanced side is no longer led to earth but is coupled galvanically between the two divided conductor loop regions on the balanced side.

In this way, there is between the unbalanced and the two balanced poles, for example on the amplifier side, an electrical-galvanic and simultaneously an electromagnetic-transformational coupling. As is represented in addition further on, this leads, in comparison to the balancing transformer of the state of the art, to a substantially more balanced power distribution between the two poles of the balanced side of the balancing transformer and to a significant increase in the relative band width of the balancing transformer.

BRIEF DESCRIPTION OF THE DRAWINGS

The embodiment of the balancing transformer according to the invention is explained subsequently in more detail with reference to the drawing. There are shown in the drawing.

DETAILED DESCRIPTION OF THE PREFERRED EMBODIMENT(S)

Figure 3:
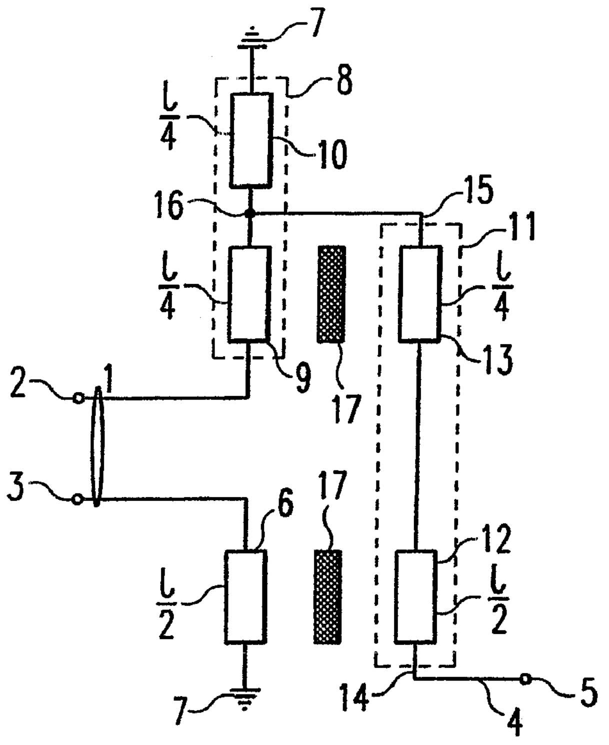

The technical circuit model of the balancing transformer according to the invention in FIG. 3 has a first signal input/output 1 with the two balanced poles 2 and 3 and a second signal input/output 4 with a pole 5. The two balanced poles 2 and 3 of the first signal input/output 1 are connected to the two inputs of a power transistor amplifier which is not shown in FIG. 3. The pole 5 of the second signal input/output 4 can be connected for example to an inner conductor of a coaxial line, not illustrated in FIG. 3. However, it can also be connected to an unbalanced strip line, coplanar line or triplate line.

One of the two balanced poles 3 of the first signal input/output 1 is led to earth 7 via a first conductor loop region 6 which, in the technical circuit model of the balancing transformer in FIG. 3, has an intrinsic resistance component. The other of the two balanced poles 2 of the first signal input/output 1 is lead to earth 7 via a first serial circuit 8, comprising two first conductor loop regions 9 and 10 which likewise have an intrinsic impedance component. In order to achieve electrical balance between the two poles 2 and 3 and respectively the common earth 7, the component of the first conductor loop region 6 is constructed balanced relative to the component of the first serial circuit 8, comprising the two first conductor loop regions 9 and 10.

The first outer connection 14 of a second serial circuit 11, comprising the second conductor loop regions 12 and 13, is connected to the pole 5 of the second signal input/output 4. The two second conductor loop regions 12 and 13 respectively have intrinsic impedances which are designed respectively balanced relative to each other. The second outer connection 15 of the second serial circuit 11 is connected galvanically to the intermediate connection 16 of the first serial circuit 8 of the two first conductor loop regions 9 and 10.

In addition to this electrical-galvanic coupling between the first signal input/output 1 and the second signal input/output 4, there is an electromagnetic-transformational coupling 17 between the component of the first conductor loop region 6 and the component of the second conductor loop region 12 and also between the component of the first conductor loop region 9 and the component of the second conductor loop region 13. The intrinsic impedance components of the first and second conductor loop regions 6, 9, 12 and 13 are designed balanced analogously to the corresponding components. The design of the second conductor loop regions 12 and 13 and also the balanced design of the first conductor loop region 6 relative to the first serial circuit 8, comprising the two first conductor loop regions 9 and 10, effects, via the electrical-galvanic coupling and also the electromagnetic-transformational coupling, a balanced transfer between the first signal input/output 1 and the second signal input/output 4 and vice versa.

Figure 4:
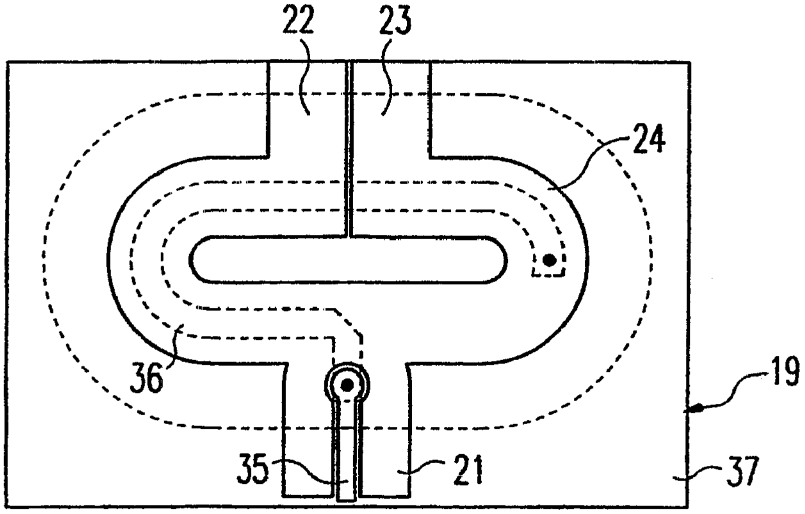
Figure 5:
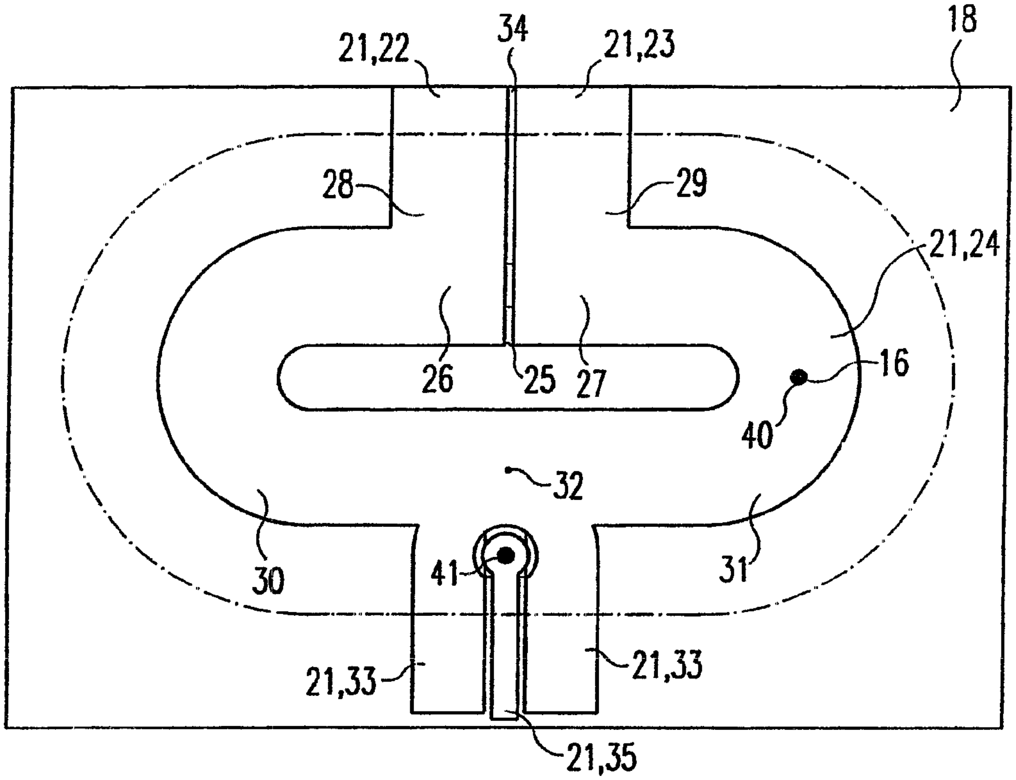
Figure 6:
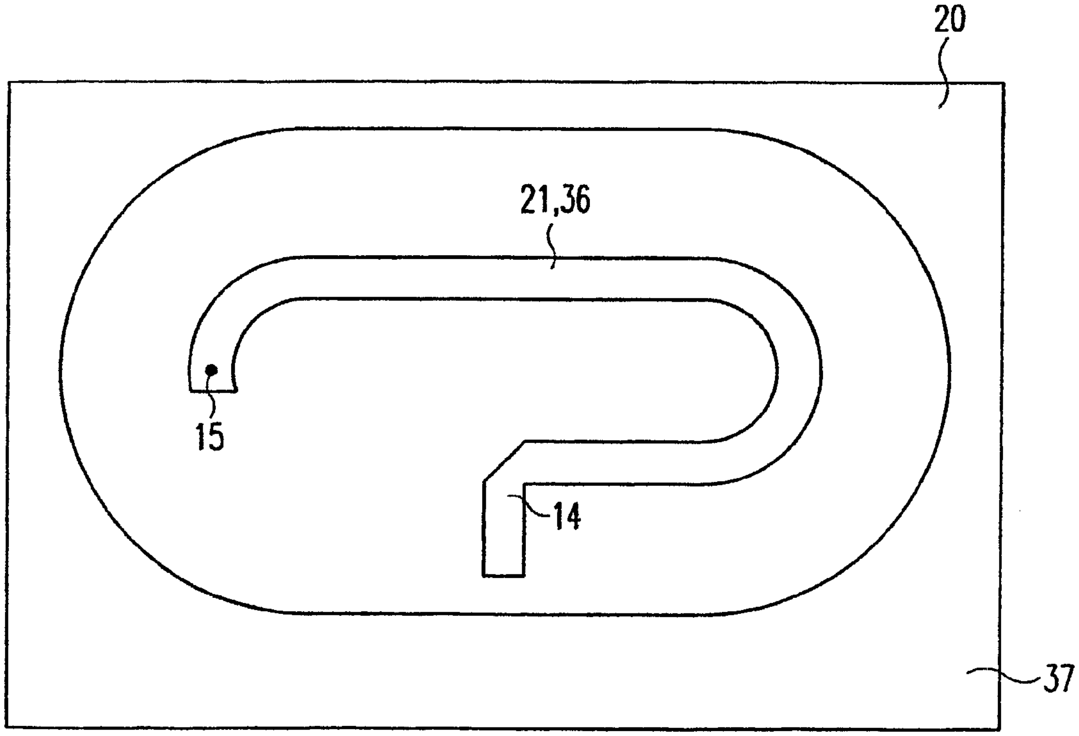

In FIG. 4, a balancing transformer produced in strip line technology by means of a printed circuit board 19 is represented. FIG. 5 shows a view—"view from above"—on the first side 18 of the printed circuit board 19, FIG. 6 shows a view—"view from below"—on the second side 20 of the printed circuit board 19.

The two poles 2 and 3 of the first signal input/output 1, the pole 5 of the second signal input/output 4, the first conductor loop regions 6, 9 and 10 and the second conductor loop regions 12 and 13 are produced as strip conductors 21 on the first and second side 18 and 20 of the printed circuit board 19.

One of the two balanced poles 2 of the first signal input/output 1 is produced as first linearly extending strip conductor 22. At a small spacing 34 relative to the first linearly extending strip conductor 22, a second linearly extending conductor strip 23 is disposed which is assigned to the other of the two balanced poles 3 of the first signal input/output 1. The first conductor loop regions 6, 9 and 10 are combined to form an almost closed conductor loop 24 apart from the gap 25. The two ends 26 and 27 of this conductor loop 24 are connected respectively to an end 28 and 29 of the two linearly extending strip conductors 22 and 23. The clear spacing 34 of the two strip conductors 22 and 23 thereby corresponds to the width of the gap 25.

One half of the loop 30 of the conductor loop 24 thereby includes the first conductor loop regions 9 and 10 which are disposed between the pole 2 of the first signal input/output 1 and the common earth 7, the other half of the loop 31 of the conductor loop 24 includes the conductor loop region 6 which is disposed between the pole 3 of the first signal input/output 1 and the common earth 7. Preferably the intermediate connection 16 of the first serial circuit 8, comprising the two first conductor loop regions 9 and 10, is fixed approximately in the middle of the half of the loop 30 of the almost closed conductor loop 24.

The intersection point of the two loop halves 30 and 31 of the almost closed conductor loop 24, which intersection point is disposed on the first side 18 of the printed circuit board 19 opposite the first signal input/output 1 with its two first and second linear strip conductors 22 and 23 configured as poles 2 and 3, forms the cold point 32. This can be used for a direct current supply to the balanced inputs or outputs 1 and for thermal diversion to earth. For the direct current supply, two parallel extending strip conductor members 33 in the region of the cold point 32 are led to the almost closed conductor loop 24, which are assisted to earth by intermediate connection respectively of a condenser which is not shown in FIG. 4 or 5. The thermal diversion to earth is effected by a through-contact of the cold point 32 to earth on the second side 20 of the printed circuit board 19, said through-contact likewise not being shown in FIG. 4 to 6.

Between the two parallel extending strip conductor members 33, a third linearly extending strip conductor 35 is disposed on the first side 18 of the printed circuit board 19 and produces the pole 5 of the second signal input/output 4 of the balancing transformer.

On the second side 20 of the printed circuit board 19, a loop-shaped strip conductor 36 is configured, which strip conductor produces the conductor loop of the two second conductor loop regions 12 and 13. This loop-shaped strip conductor 36 is aligned geometrically on the second side 20 of the printed circuit board 19 in such a manner that it is situated centrally above the strip conductor 24 on the first side 18 of the printed circuit board 19.

The first and second outer connection 14 and 15 of the second serial circuit 11 of the two second conductor loop regions 12 and 13 which are positioned respectively at the ends of the loop-shaped strip conductor 36, are thereby disposed in the region of the intermediate connection 16 of the first serial circuit 8 of the first conductor loop regions 9 and 10 on the loop half 30 of the almost closed conductor loop 24 and in the region of the pole 5 of the second signal input/output 4 on the third linear strip conductor 35. Hence the first conductor loop region 6 is congruent directly parallel to the second conductor loop region 12 and also the first conductor loop region 9 is congruent directly parallel to the second conductor loop region 13 in order to achieve as efficient an electromagnetic-transformational coupling as possible between the first signal input/output 1 and the second signal input/output 4.

The intermediate connection 16 of the first serial circuit 8 of the two first conductor loop regions 9 and 10 on the loop half 30 of the almost closed conductor loop 24 on the first side 18 of the printed circuit board 19 is connected electrically preferably via a through-contact 40 of the printed circuit board 19 to the second outer connection 15 of the second serial circuit 11 of the second conductor loop regions 12 and 13 at one end of the loop-shaped strip conductor 36 on the second side 20 of the printed circuit board 19. Analogously, the pole 5 of the second signal input 4 on the third linearly extending strip conductor 35 on the first side 18 of the printed circuit board 19 is connected electrically via a through-contact 41 of the printed circuit board 19 to the first outer connection 14 of the second serial circuit 11 of the second conductor loop regions 12 and 13 at the other end of the loop-shaped strip conductor 36 on the second side 20 of the printed circuit board 19.

The loop-shaped strip conductor 36 associated with the second conductor loop regions 12 and 13 on the second side 20 of the printed circuit board 19 is surrounded by a common earth conductor 37.

Figure 7:
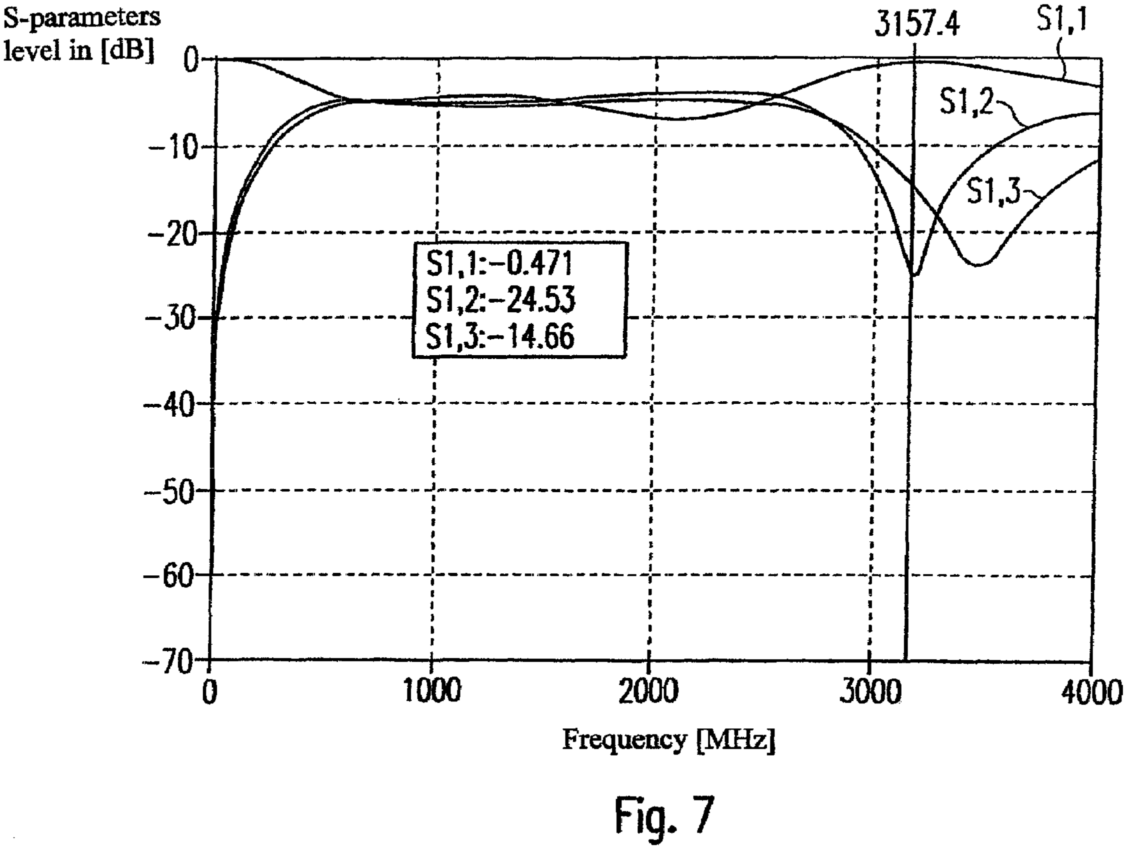

In FIG. 7, the transfer behaviour of the balancing transformer according to the invention which was determined in the form of S-parameters with a field simulator is represented.

Figure 1:
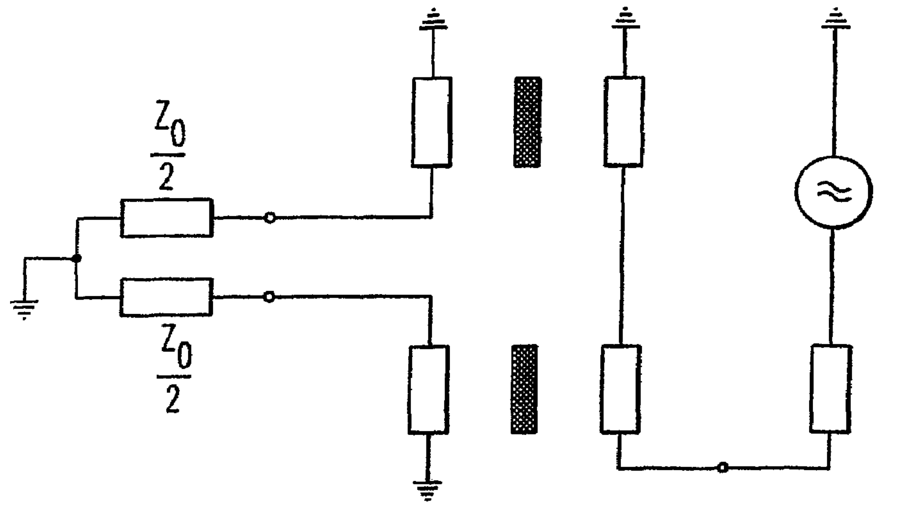
Fig. 1 PRIOR ART
FIG. 1 a technical circuit model of the balancing transformer according to the state of the art, FIG. 2 a graphic representation of the transfer behaviour of the balancing transformer according to the state of the art, FIG. 3 a technical circuit model of the balancing transformer according to the invention, FIG. 4 a view of a balancing transformer according to the invention, FIG. 5 a "view from above" on the balancing transformer according to the invention, FIG. 6 a "view from below" on the balancing transformer according to the invention and FIG. 7 a graphic representation of the transfer behaviour of the balancing transformer according to the invention.
Figure 2:
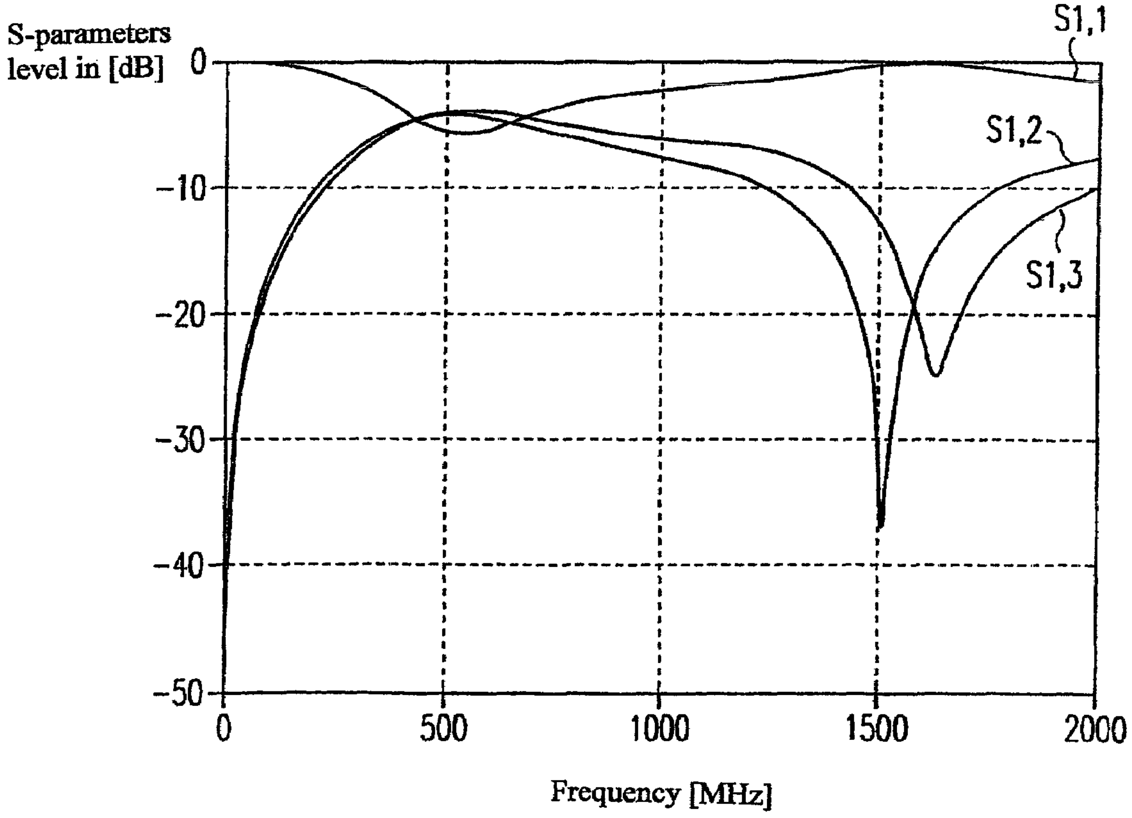
Fig. 2 PRIOR ART

In contrast to the transfer behaviour of the balancing transformer according to the state of the art in FIG. 2, the balancing transformer according to the invention, with a given design in its transfer behaviour, has resonances only at a frequency of above 3 GHz. The balancing transformer according to the invention can consequently be operated without problems up to an operating frequency of approx. 2.5 GHz. In addition to its higher relative band width, the balancing transformer according to the invention has, in its non-problematic operating frequency range, a substantially higher balance between the two balanced poles 2 and 3 of the first signal input/output 1. The characteristic line of transfer in the signal path from the pole 5 of the second signal input 4 to the pole 2 of the first signal input/output 1 (S-parameters S1, 2 in FIG. 7) has, in the operating frequency range up to approx. 1.6 GHz, a virtually identical configuration to the characteristic line of transfer in the signal path from the pole 5 of the second signal input/output 4 to the pole 3 of the first signal input/output 1 (S-parameters S1, 3 in FIG. 7).

The intermediate connection 16 is preferably disposed such that the lengths 1 of the first conductor loop regions 9, 10 forming the first serial circuit 8 is a ratio of 1:3 to 3:1. With respect to the inventive concept, the length 1 of the second conductor loop region 13 of the second serial circuit 11 should be adapted to the length 1 of the first conductor loop region 9 of the first serial circuit 8. As illustrated in FIG. 3, the two conductor loop regions 9 and 10 of the first serial circuit 8 preferably have a ratio of 1:1. In the case of a balanced length design of the first conductor loop region 6 to the first serial circuit 8 of the first conductor loop regions 9 and 10 of respectively ½, the first conductor loop region 9 consequently has a length of ¼. The second conductor loop region 13 of the second serial circuit 11 is consequently adapted with a length of ¼.

The invention is not restricted to the represented embodiment. In particular, similar or analogous conductor strip configurations and arrangements which however have the same effect on the band width and balancing of the balancing transformer as the balancing transformer represented above, are covered by the invention.

The invention claimed is:

1. Balancing transformer comprising:

a first signal input/output with two poles which are balanced relative to each other;

a second signal input/output with a pole;

a plurality of first conductor loop regions which are disposed between the two poles of the first signal input/output and earth; and a second serial circuit including a plurality of second conductor loop regions, the first connection of which is connected to the pole of the second signal input/output, two of said second conductor loop regions being coupled electromagnetically to respectively one first conductor loop region;

wherein a second connection of the second serial circuit of a plurality of second conductor loop regions is connected electrically to an intermediate connection of a first serial circuit of a plurality of first conductor loop regions which connects a balanced pole of the first signal input/output to earth.

2. The balancing transformer of claim 1, wherein a first serial circuit comprises two first conductor loop regions and the second serial circuit comprises two second conductor loop regions and the other balanced pole of the first signal input/output is connected to earth via a first conductor loop region.

3. The balancing transformer of claim 1 wherein the two poles of the first signal input/output which are balanced relative to each other, the pole of the second signal input/output and all first and second conductor loop regions are produced as strip conductors which are disposed on both sides on a printed circuit board.

4. The balancing transformer of claim 3, wherein the two poles of the first signal input/output are produced via respectively a first and second strip conductor extending linearly relative to each other at a small spacing on a first side of the printed circuit board.

5. The balancing transformer of claim 4, wherein all the first conductor loop regions are produced in a conductor loop which is almost closed, apart from a gap, and disposed on the first side of the printed circuit board, said conductor loop being connected with its two ends respectively to an end of the first and second strip conductor, the width of the gap corresponding to the spacing between the first and second strip conductor.

6. The balancing transformer of claim 5, wherein in two loop halves of the almost closed conductor loop respectively the first conductor loop regions are produced which are situated between one of the two balanced poles of the first signal input and earth.

7. The balancing transformer of claim 5 wherein on the first side of the printed circuit board, a cold point is located in the region of the almost closed conductor loop situated opposite the first signal input.

8. The balancing transformer of claim 7, wherein the parallel extending strip conductor members which are connected in the region of the cold point directly to the almost closed conductor loop are used for supplying direct current or thermal diversion to earth.

9. The balancing transformer of claim 8, wherein a third linearly extending strip conductor which produces the pole of the second signal input is disposed between the two strip conductor members.

10. The balancing transformer of claim 8 wherein in a loop-shaped strip conductor which is disposed parallel to the almost closed conductor loop on the second side of the printed circuit board between the intermediate connection of the two first conductor strip regions and the pole of the second signal input/output, the second serial circuit of the two second conductor loop regions is produced.

11. The balancing transformer of claim 10, wherein the intermediate connection of the first serial circuit of the first conductor loop regions on the almost closed conductor loop of the first side of the printed circuit board is connected by means of through-contacting of the printed circuit board to the second connection of the second serial circuit of the second conductor loop regions on the loop shaped strip conductor of the second side of the printed circuit board.

12. The balancing transformer of claim 10 wherein the first conductor loop regions and the second conductor loop regions on the second side of the printed circuit board are surrounded by a common earth conductor.

13. The balancing transformer of claim 1 wherein the intermediate connection is disposed such that the lengths of the first conductor loop regions forming the first serial circuit have a ratio of 1:3 to 3:1.

14. The balancing transformer of claim 13 wherein the lengths of the first conductor loop regions forming the first serial circuit have a ratio of 1:1.

* * * * *